US008808452B2

(12) United States Patent
Noro et al.

(10) Patent No.: US 8,808,452 B2
(45) Date of Patent: Aug. 19, 2014

(54) SILICON FILM FORMATION APPARATUS AND METHOD FOR USING SAME

(75) Inventors: Naotaka Noro, Nirasaki (JP); Takahiro Miyahara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1033 days.

(21) Appl. No.: 12/707,299

(22) Filed: Feb. 17, 2010

(65) Prior Publication Data

US 2010/0212581 A1 Aug. 26, 2010

(30) Foreign Application Priority Data

Feb. 20, 2009 (JP) ................................ 2009-038661
Dec. 24, 2009 (JP) ................................ 2009-293125

(51) Int. Cl.
| C30B 25/02 | (2006.01) |
| C30B 25/20 | (2006.01) |
| C30B 29/06 | (2006.01) |
| C30B 25/12 | (2006.01) |
| C30B 25/08 | (2006.01) |

(52) U.S. Cl.
CPC ................. *C30B 25/02* (2013.01); *C30B 25/20* (2013.01); *C30B 29/06* (2013.01); *C30B 25/12* (2013.01); *C30B 25/08* (2013.01)
USPC ............... 117/97; 117/104; 117/88; 117/935; 118/44

(58) Field of Classification Search
CPC .......... C30B 25/02; C30B 25/20; C30B 29/06
USPC .............................................. 117/97; 118/44
See application file for complete search history.

(56) References Cited

U.S. PATENT DOCUMENTS

| 5,863,602 A * | 1/1999 | Watanabe et al. ............. 427/237 |
| 7,611,995 B2 * | 11/2009 | Hasebe et al. ................. 438/723 |
| 2006/0216941 A1 | 9/2006 | Hasebe et al. |
| 2006/0288935 A1 * | 12/2006 | Kato et al. ..................... 118/715 |
| 2008/0090389 A1 * | 4/2008 | Wang et al. .................... 438/503 |
| 2009/0305517 A1 * | 12/2009 | Nakashima et al. .......... 438/786 |

FOREIGN PATENT DOCUMENTS

| JP | 9-320970 | 12/1997 |
| JP | 2004-343094 | 12/2004 |

(Continued)

OTHER PUBLICATIONS

Japanese Office Action issued Jun. 12, 2012 in Patent Application No. 2009-293125 with Partial English Translation.

*Primary Examiner* — Michael Kornakov
*Assistant Examiner* — Hua Qi
(74) *Attorney, Agent, or Firm* — Oblon, Spivak, McClelland, Maier & Neustadt, L.L.P.

(57) ABSTRACT

A method for using a silicon film formation apparatus includes performing a pre-coating process to cover a reaction tube with a silicon coating film, an etching process to etch natural oxide films on product target objects, a silicon film formation process to form a silicon product film on the product target objects, and a cleaning process to etch silicon films on the reaction tube, in this order. The pre-coating process includes supplying a silicon source gas into the reaction tube from a first supply port having a lowermost opening at a first position below the process field, while exhausting gas upward from inside the reaction tube. The etching process includes supplying an etching gas into the reaction tube from a second supply port having a lowermost opening between the process field and the first position, while exhausting gas upward from inside the reaction tube by the exhaust system.

9 Claims, 12 Drawing Sheets

(56) References Cited

FOREIGN PATENT DOCUMENTS

| | | |
|---|---|---|
| JP | 2007-5481 | 1/2007 |
| JP | WO 2007/116768 A1 | 10/2007 |
| JP | 2008-28307 | 2/2008 |
| WO | WO 2007116768 A1 * | 10/2007 ............ H01L 21/205 |

* cited by examiner

SILICON FILM FORMATION APPARATUS AND METHOD FOR USING SAME

CROSS-REFERENCE TO RELATED PATENT APPLICATIONS

This application claims the benefit of priority from Japanese Patent Applications No. 2009-038661, filed on Feb. 20, 2009, and No. 2009-293125, filed on Dec. 24, 2009, in the Japan Patent Office, the disclosure of both of which is incorporated herein in the entirety by reference.

BACKGROUND OF THE INVENTION

1. Field of the Invention

The present invention relates to a film formation apparatus for a semiconductor process for forming a silicon film on target objects, such as semiconductor wafers, and a method for using the apparatus. The term "semiconductor process" used herein includes various kinds of processes which are performed to manufacture a semiconductor device or a structure having wiring layers, electrodes, and the like to be connected to a semiconductor device, on a target object, such as a semiconductor wafer or a glass substrate used for an FPD (Flat Panel Display), e.g., an LCD (Liquid Crystal Display), by forming semiconductor layers, insulating layers, and conductive layers in predetermined patterns on the target object.

2. Description of the Related Art

As a semiconductor device manufacturing apparatus for performing a heat process on the surface of a target object, such as a semiconductor wafer (which may be simply referred to as a wafer), there is a vertical heat processing apparatus of the hot wall type, which is a so-called batch furnace. A vertical heat processing apparatus includes a vertical reaction tube or reaction container made of, e.g., quartz with a heater disposed around it. A number of wafers are held on a holder or wafer boat as in shelves and are loaded into the reaction tube. A process gas is supplied into the reaction tube while the reaction tube is heated by the heater, so that a heat process is performed on the wafers all together.

FIG. 12 is a sectional side view showing a vertical heat processing apparatus (silicon film formation apparatus) conventionally used. This apparatus includes a vertical reaction tube 1 disposed inside a furnace 17a having a heater 17 extending on the inner surface. A wafer boat 21 is placed on a lid 2 and is moved up and down by the lid 2 between a position inside the reaction tube 1 and a position below the reaction tube 1. Gas supply lines are inserted in the flange of the reaction tube 1 and an exhaust port 15 is formed at the top of the reaction tube 1 such that gas flows inside the reaction tube 1 from the bottom to the top. In FIG. 12, only a gas supply line 12 for mono-silane gas and a gas supply line 14 for hydrogen fluoride gas are shown as part of various gas supply lines, for the sake of convenience. The reaction tube 1 and wafer boat 21 are made of quartz. One of the reasons for this is that it is necessary to form an Si (silicon) atmosphere inside the reaction tube 1 when silicon epitaxial growth is performed on silicon wafers.

When silicon epitaxial growth is performed on silicon wafers W, silicon needs to be exposed on the surface of the wafers W. However, when the wafers W are transferred under atmospheric air, natural oxide films (silicon oxide films), which hinder the epitaxial growth, are produced on the surface. Accordingly, the natural oxide films on the surface of the wafers W are etched and thereby removed by supplying a mixture gas of hydrogen fluoride (HF) gas and ammonia (NH$_3$) gas. Then, the silicon epitaxial growth is performed on the wafers W from which the natural oxide films have been removed.

Where hydrogen fluoride (HF) gas is solely used for etching natural oxide films, reactions are caused as shown in the following formula (1). On the other hand, where hydrogen fluoride (HF) gas and ammonia (NH$_3$) gas are used for etching natural oxide films, reactions are caused as shown in the following formulas (2) and (3).

$$SiO_2 + 4HF \rightarrow SiF_4 + 2H_2O \qquad (1)$$

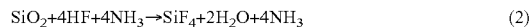

$$SiO_2 + 4HF + 4NH_3 \rightarrow SiF_4 + 2H_2O + 4NH_3 \qquad (2)$$

$$SiF_4 + 2HF + 2NH_3 \rightarrow SiF_4 + (NH_4)_2SiF_6 \qquad (3)$$

The formula (1) needs reaction energy of 1.04 eV, while the formulas (2) and (3) need reaction energy of 0.49 eV and 0 eV, respectively. Further, (NH$_4$)$_2$SiF$_6$ (ammonium silicofluoride) generated in the formula (3) sublimes at about 200° C. and is thereby easily removed along with exhaust gas. In other words, the hydrogen fluoride gas serves as a gas for etching the natural oxide films, while the ammonia gas serves as a gas for lowering the necessary reaction energy for this etching and promoting vaporization of products generated by this etching (i.e., increasing the etching rate and improving the selectivity of removal for natural oxide films). Accordingly, in the explanation hereinafter, the hydrogen fluoride gas is referred to as an etching gas, while the ammonia gas is referred to as a vaporization promoting gas, as needed.

However, as described later, the present inventors have found that conventional methods for using a film formation apparatus for a semiconductor process of this kind have room for improvement in terms of problems concerning particle generation.

BRIEF SUMMARY OF THE INVENTION

An object of the present invention is to provide a silicon film formation apparatus and a method for using the same, which can improve characteristics of the apparatus concerning the particle generation.

According to a first aspect of the present invention, there is provided a method for using a silicon film formation apparatus, the apparatus comprising a vertical reaction tube made of quartz and having a process field for accommodating a plurality of target objects, a holder made of quartz and configured to hold the target objects at intervals in a vertical direction inside the process field, a heater disposed around the reaction tube and configured to heat the target objects inside the process field, a gas supply system configured to supply process gases into the process field, and an exhaust system configured to exhaust gas from inside the reaction tube while drawing gas upward through the process field, the method comprising: performing a pre-coating process inside the reaction tube accommodating the holder with no product target objects held thereon to cover an inner surface of the reaction tube and a surface of the holder with a silicon coating film, by supplying a silicon source gas into the reaction tube from a first supply port having a lowermost opening at a first position below the process field, while exhausting gas from inside the reaction tube by the exhaust system; then, performing an etching process inside the reaction tube accommodating the holder with a plurality of product target objects held thereon to etch natural oxide films formed on a surface of the product target objects, by supplying an etching gas into the reaction tube from a second supply port having a lowermost opening between the process field and the first position, while exhausting gas from inside the reaction tube by the exhaust system; then, performing a silicon film formation process inside the reaction tube accommodating the holder with the product target objects held thereon to form a silicon product film on the surface of the product target objects, by supplying the silicon source gas into the reaction tube from the first supply port, while exhausting gas from inside the reaction tube by the exhaust system; and then, performing a cleaning process inside the reaction tube accommodating the holder with no product target objects held thereon to etch silicon films present on the inner surface of the reaction tube and the surface of the holder, by supplying a cleaning gas into the reaction tube from a third supply port having a lowermost opening at a position equal in height to or below the first position, while exhausting gas from inside the reaction tube by the exhaust system.

According to a second aspect of the present invention, there is provided a silicon film formation apparatus comprising: a vertical reaction tube made of quartz and having a process field for accommodating a plurality of target objects; a holder made of quartz and configured to hold the target objects at intervals in a vertical direction inside the process field; a heater disposed around the reaction tube and configured to heat the target objects inside the process field; a gas supply system configured to supply process gases into the process field; an exhaust system configured to exhaust gas from inside the reaction tube while drawing gas upward through the process field; and a control section configured to control an operation of the apparatus, wherein the gas supply system includes a first supply system configured to supply a silicon source gas into the reaction tube from a first supply port having a lowermost opening at a first position below the process field, a second supply system configured to supply an etching gas into the reaction tube from a second supply port having a lowermost opening between the process field and the first position, and a third supply system configured to supply a cleaning gas into the reaction tube from a third supply port having a lowermost opening at a position equal in height to or below the first position, and wherein the control section is preset to execute a method for using the apparatus, and the method comprises performing a pre-coating process inside the reaction tube accommodating the holder with no product target objects held thereon to cover an inner surface of the reaction tube and a surface of the holder with a silicon coating film, by supplying the silicon source gas into the reaction tube from the first supply port, while exhausting gas from inside the reaction tube by the exhaust system, then, performing an etching process inside the reaction tube accommodating the holder with a plurality of product target objects held thereon to etch natural oxide films formed on a surface of the product target objects, by supplying the etching gas into the reaction tube from the second supply port, while exhausting gas from inside the reaction tube by the exhaust system, then, performing a silicon film formation process inside the reaction tube accommodating the holder with the product target objects held thereon to form a silicon product film on the surface of the product target objects, by supplying the silicon source gas into the reaction tube from the first supply port, while exhausting gas from inside the reaction tube by the exhaust system, and then, performing a cleaning process inside the reaction tube accommodating the holder with no product target objects held thereon to etch silicon films present on the inner surface of the reaction tube and the surface of the holder, by supplying the cleaning gas into the reaction tube from the third supply port, while exhausting gas from inside the reaction tube by the exhaust system.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

In the process of developing the present invention, the inventors studied problems with regard to conventional methods for using a film formation apparatus for a semiconductor process of this kind. As a result, the inventors have arrived at the findings given below.

Figure 12:
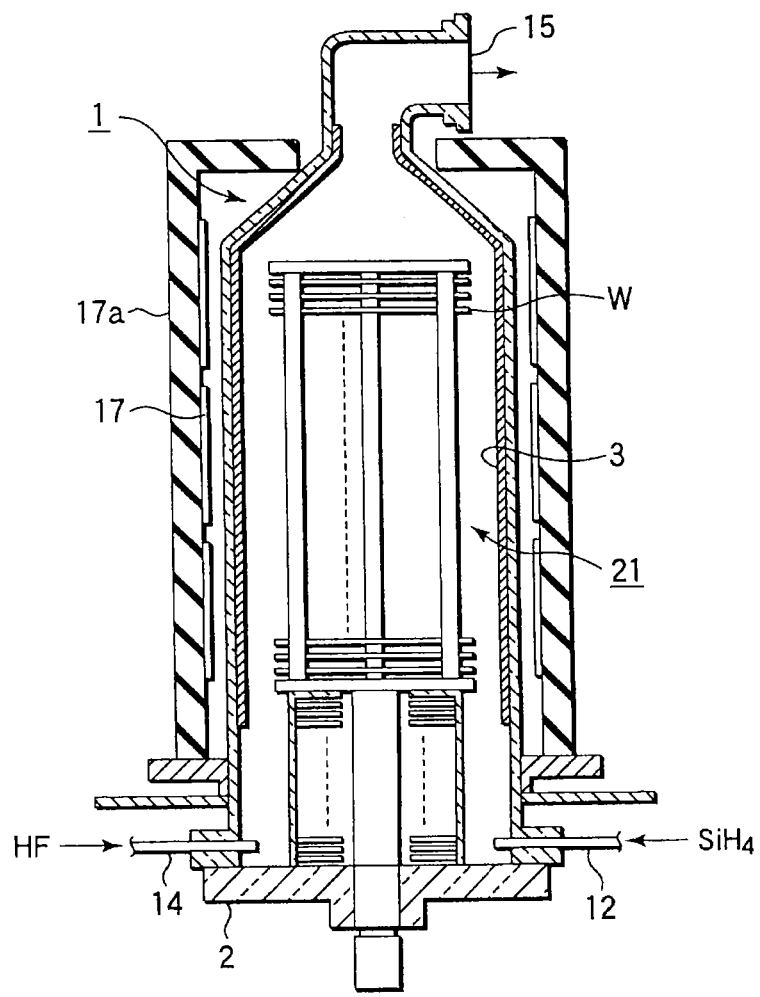
FIG. 12 is a sectional side view showing a vertical heat processing apparatus (silicon film formation apparatus) conventionally used.

As described previously, when a film formation process is performed on the surface of silicon wafers W, the natural oxide films (silicon oxide films) on the surface of the wafers W are etched by use of hydrogen fluoride gas before the film formation process. However, since quartz is silicon oxide, quartz components, such as the reaction tube 1 and wafer boat 21 shown in FIG. 12, are also etched by the hydrogen fluoride gas. Accordingly, before the hydrogen fluoride gas is supplied, a pre-coating process is performed to cover the interior of the reaction tube 1 with a (poly-) silicon coating film 3, thereby protecting the quartz. After a silicon product film is formed on the wafers, all the unnecessary silicon films including the silicon coating film 3 inside the reaction tube 1 are removed by fluorine ($F_2$) gas.

In the sequence described above, since the silicon coating film 3 is formed by CVD (Chemical Vapor Deposition), the silicon coating film 3 is not formed on a lower side of the reaction tube 1 where it is insufficiently heated by the heater 17. Consequently, quartz portions on this lower side are etched by the hydrogen fluoride gas and particles are thereby generated. If the wafers are contaminated with particles, the yield of semiconductor devices is deteriorated.

On the other hand, Jpn. Pat. Appln. KOKAI Publication No. 2008-28307 (see paragraphs 0023 and 0024) discloses a vertical heat processing apparatus including a reaction tube and a wafer boat made of silicon carbide (SiC) or silicon. Silicon carbide and silicon are not etched by a mixture gas of hydrogen fluoride gas and ammonia gas. However, when epitaxial growth is performed on wafers, poly-silicon is formed not only on the wafers but also on the reaction tube and wafer boat as by-products. Such by-products are removed afterward by a cleaning process using fluorine ($F_2$) gas. At this time, the silicon carbide or silicon of the reaction tube and so forth is etched by the fluorine gas. Accordingly, the vertical heat processing apparatus disclosed in Jpn. Pat. Appln. KOKAI Publication No. 2008-28307 is not suitable as an apparatus for performing silicon epitaxial growth on wafers.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

First Embodiment

Figure 1:
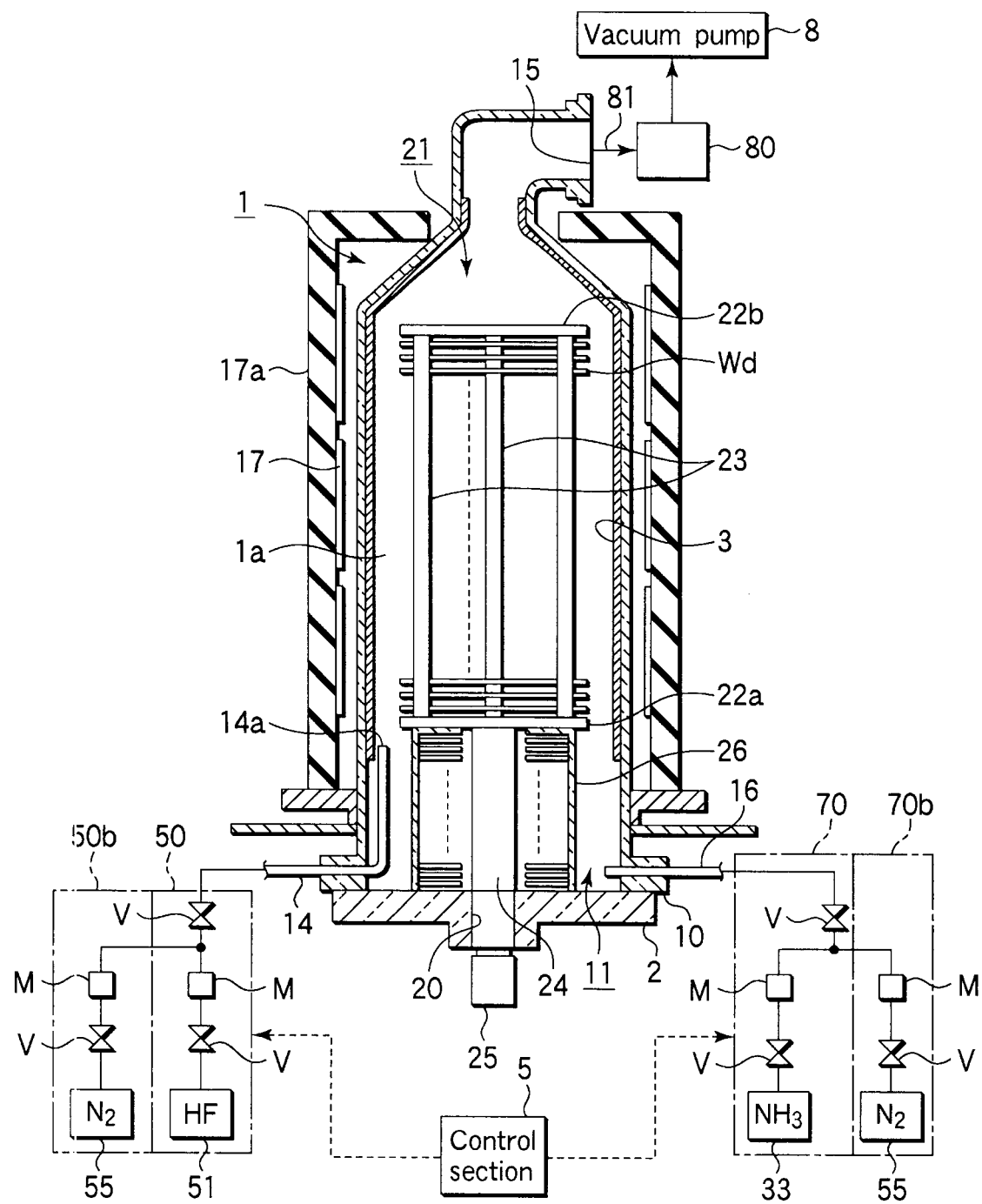
FIG. 1 is a sectional side view showing a vertical heat processing apparatus (silicon film formation apparatus) according to a first embodiment of the present invention.
Figure 2:
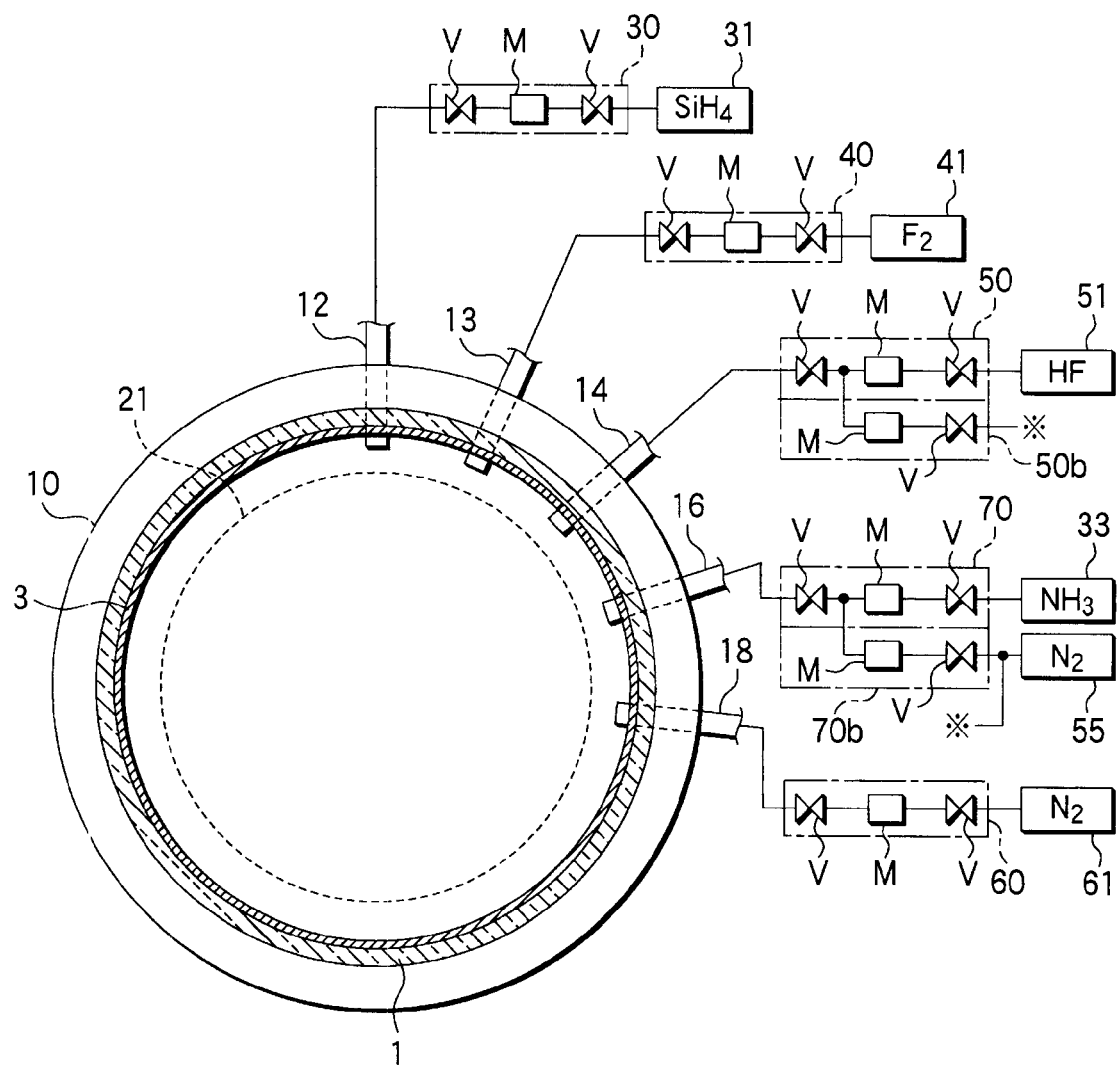
FIG. 2 is a sectional plan view showing an example of the plan view layout of injectors used in the heat processing apparatus shown in FIG. 1.
Figure 3:
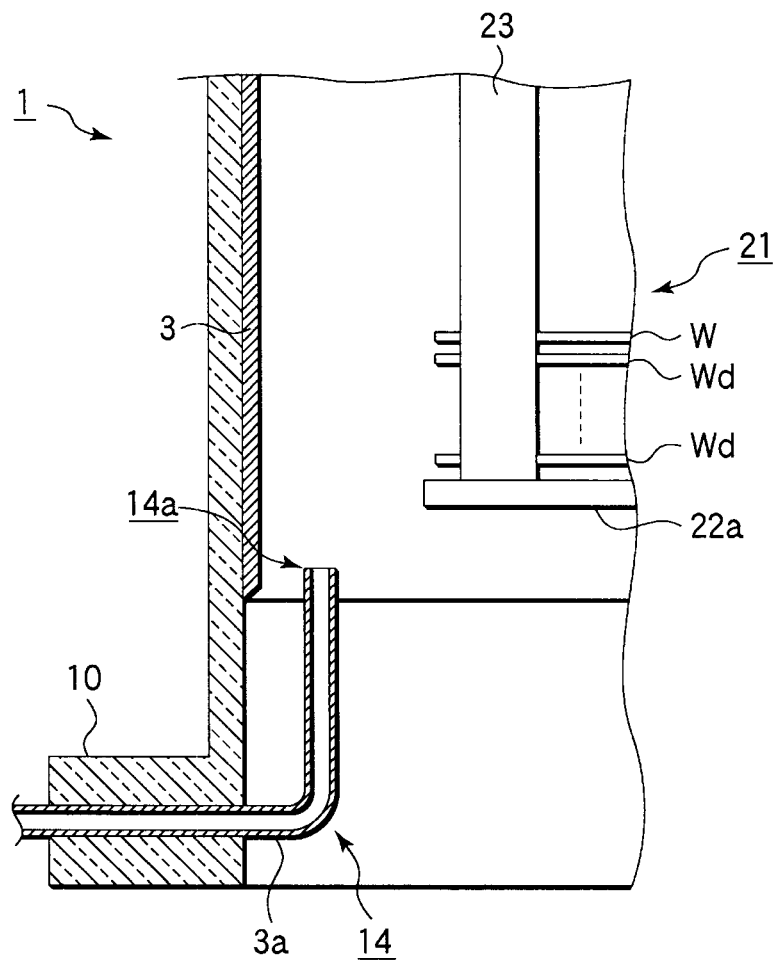
FIG. 3 is a sectional view showing a main portion of the heat processing apparatus shown in FIG. 1.

FIG. 1 is a sectional side view showing a vertical heat processing apparatus (silicon film formation apparatus) according to a first embodiment of the present invention. FIG. 2 is a sectional plan view showing an example of the plan view layout of injectors used in the heat processing apparatus shown in FIG. 1. FIG. 3 is a sectional view showing a main portion of the heat processing apparatus shown in FIG. 1.

As shown in FIG. 1, the vertical heat processing apparatus (film formation apparatus) includes a cylindrical reaction tube 1 made of quartz and directed vertically. The reaction tube 1 defines a process filed (heat processing zone) 1 therein for accommodating a wafer boat 21 that hold a plurality of semiconductor wafers W at intervals in the vertical direction. The reaction tube 1 is opened at the bottom to form a load port 11, around which a flange 10 is integrally formed. A lid 2 coated with a cover made of, e.g., quartz is disposed below the reaction tube 1, so that the lid 2 can come into contact with the bottom of the flange 10 to airtightly close the port 11. The lid 2 is moved up and down by a boat elevator (not shown) to open and close the port. A rotary shaft 24 extends through a through-hole 20 at the center of the lid 2, and supports at the top a substrate holder or wafer boat 21 made of quartz.

The wafer boat 21 includes a bottom plate 22a and a top plate 22b, and three or more struts 23 extending between the plates 22a and 22b. The struts 23 have grooves (slots) to support a plurality of, e.g., 125, target objects or semiconductor wafers W stacked at intervals. The 125 wafers W include dummy wafers Wd disposed at the top and bottom sides, each side being provided with five dummy wafers, and product wafers placed therebetween at intervals in the vertical direction. The bottom of the rotary shaft 24 is connected to a motor 25 for rotating the rotary shaft 24, so that the wafer boat 21 is rotated by the motor 25. A heat-insulating cylinder 26 is disposed on the lid 2 and surrounds the rotary shaft 24.

An exhaust port 15 is formed at the top of the reaction tube 1 to exhaust the interior of the reaction tube 1. The exhaust port 15 is connected to an exhaust line 81 provided with a vacuum pump 8 and a pressure control mechanism 80 to vacuum-exhaust the interior of the reaction tube 1 to a desired vacuum level. A furnace 17a is disposed around the reaction tube 1, and includes a heater 17 made of a resistance heating body for heating up the interior of the reaction tube 1. The heater 17 comprises three heating elements respectively disposed at the upper zone, middle zone, and lower zone of the process field 1a and configured to control the temperature of the zones independently of each other.

A plurality of injectors 12, 13, 14, 16, and 18 are disposed to horizontally extend at essentially the same height through the flange 10 at the bottom of the reaction tube 1, and are used to supply process gases into the reaction tube 1. As shown in FIG. 2, the injectors 12, 13, 14, 16, and 18 are disposed side by side equidistantly in the annular direction of the flange 10, and are gathered in one area to be close to each other in the annular direction, so that maintenance can be easily performed.

The first injector 12 is formed of a straight injector penetrating the flange 10 and horizontally extending toward the center of the reaction tube 1. The first injector 12 is connected to a first gas supply source 31 through a line provided with a first gas regulating section 30 including a flow rate controller M and two valves V respectively disposed upstream and downstream from this controller M. The first gas supply source 31 is configured to supply a silicon source gas in performing a pre-coating process for forming a silicon coating film and in performing a vapor phase epitaxial growth process for growing a silicon epitaxial film on the wafers W. In this embodiment, the silicon source gas is a silane family gas, such as mono-silane ($SiH_4$) gas.

The second injector 13 is formed of a straight injector penetrating the flange 10 and horizontally extending toward the center of the reaction tube 1. The second injector 13 is connected to a second gas supply source 41 through a line provided with a second gas regulating section 40 including a flow rate controller M and two valves V respectively disposed upstream and downstream from this controller M. The second gas supply source 41 is configured to supply a cleaning gas for removing a silicon coating film 3 that covers the inner surface of the reaction tube 1 and so forth and silicon by-product films deposited inside the reaction tube 1 during the epitaxial growth process performed as described later. In this embodiment, the cleaning gas is fluorine ($F_2$) gas.

The third injector 14 is formed of an L-shaped injector, as shown in FIGS. 2 and 3, which penetrates the flange 10 and horizontally extends toward the center of the reaction tube 1 at the same height as the first injector 12, and is then bent and vertically extends upward. As shown in FIG. 3, the inner surface of the third injector 14 is covered with a silicon coating film 3a formed in advance (pre-coating). The third injector 14 is connected to a third gas supply source 51 through a line provided with a third gas regulating section 50 including a flow rate controller M and two valves V respectively disposed upstream and downstream from this controller M. The third gas supply source 51 is configured to supply an etching gas for etching and removing natural oxide films formed on the surface of the wafers W. In this embodiment, the etching gas is hydrogen fluoride (HF) gas. Further, the third injector 14 is connected to a nitrogen ($N_2$) gas supply source 55 through a line branched at a position between the flow rate controller M and downstream valve V of the third gas regulating section 50 and provided with a gas regulating section 50b including a flow rate controller M and a valve V.

The fourth injector 16 is formed of a straight injector penetrating the flange 10 and horizontally extending toward the center of the reaction tube 1. The fourth injector 16 is connected to a fourth gas supply source 33 through a line provided with a fourth gas regulating section 70 including a flow rate controller M and two valves V respectively disposed upstream and downstream from this controller M. The fourth gas supply source 33 is configured to supply an auxiliary gas for assisting the natural oxide film removal by promoting vaporization of products generated in etching natural oxide films. In this embodiment, the auxiliary gas is ammonia ($NH_3$) gas. Further, the fourth injector 16 is connected to a nitrogen ($N_2$) gas supply source 55 through a line branched at a position between the flow rate controller M and downstream valve V of the fourth gas regulating section 70 and provided with a gas regulating section 70b including a flow rate controller M and a valve V.

The fifth injector 18 is formed of a straight injector penetrating the flange 10 and horizontally extending toward the center of the reaction tube 1. The fifth injector 18 is connected to a fifth gas supply source 61 through a line provided with a fifth gas regulating section 60 including a flow rate controller M and two valves V respectively disposed upstream and downstream from this controller M. The fifth gas supply source 61 is configured to supply an inactive gas for dilution, purge, or pressure control. In this embodiment, the inactive gas is nitrogen ($N_2$) gas.

It should be noted that the layout of the injectors injector 12, 13, 14, 16, and 18 is not limited to that shown in FIG. 2.

Further, this vertical heat processing apparatus includes a control section 5 configured to control the operation of the heater 17, pressure control mechanism 80, gas regulating section 30, 40, 50, 50b, 60, 70, and 70b, gas supply source 31, 33, 41, 51, 55, and 61, and so forth. The control section 5 comprises a computer including, e.g., a CPU and a storage section that stores programs. The programs includes a group of steps (commands) for controlling the vertical heat processing apparatus to conduct various operations necessary for performing film formation on the wafers W and cleaning inside the process container 1. For example, this program is stored in a storage medium, such as a hard disk, compact disk, magneto-optical disk, or memory card, and is installed therefrom into the computer.

Next, an explanation will be given of the height position of the opening end 14a or gas supply port of the third injector 14 (the position of the lowermost opening of a supply port for supplying hydrogen fluoride (HF) gas that serves as an etching gas for the natural oxide film removal). In this embodiment, as described later, a pre-coating process is performed to cover the inner surface of the reaction tube 1 and so forth with a silicon coating film 3 before silicon epitaxial growth is performed on the wafers W. The silicon coating film 3 serves to protect the quartz composing the reaction tube 1 and wafer boat 21 from the hydrogen fluoride gas supplied from the third injector 14. The silicon coating film 3 is hardly etched by hydrogen fluoride gas with a very small etching rate of about 1 nm/minute in practice.

The silicon coating film 3 is formed inside the reaction tube 1 by thermal decomposition of the silane family gas, such as mono-silane gas, supplied from the first injector 12. The heater 17 is disposed around the process field (heat process zone) 1a to perform a heat process on the wafers held on the wafer boat 21, and so the area inside the reaction tube 1 below the process field 1a cannot be sufficiently heated by the heater 17. In this respect, the film formation temperature of polysilicon films is about 560° C., and silicon films are formed in an amorphous state at a temperature lower than 560° C. Accordingly, in the strict sense, the silicon coating film 3 covering the inner surface of the reaction tube 1 comprises not only a poly-silicon film but also an amorphous silicon film formed on the lower side. In the present invention, the term "silicon coating film" encompasses both the poly-silicon film and amorphous silicon film.

As described above, the area inside the reaction tube 1 below the process field 1a cannot be sufficiently heated by the heater 17. Accordingly, the silicon coating film 3 is not formed, and so the quartz composing the reaction tube 1 is exposed, at a position distant from the heater 17 by a certain degree. Further, where the heat-insulating cylinder 26 (see FIG. 1) disposed below the wafer boat 21 is made of quartz, the same thing happens on this heat-insulating cylinder 26. When the hydrogen fluoride gas comes into contact with the quartz of the inner surface of the reaction tube 1 and so forth, the quartz is etched. In light of this, the height position of the opening end 14a of the third injector 14 is preset for the hydrogen fluoride gas supplied from the third injector 14 so as not to come into contact with the exposed quartz portion.

Specifically, the opening end 14a needs to be located above a height position approximate to the lower end of the silicon coating film 3 formed on the inner surface of the reaction tube 1 and so forth by the pre-coating process. The expression "a height position approximate to the lower end of the silicon coating film" means not only the same height position as the lower end of the silicon coating film 3, but also a height position slightly lower (specifically, about 3 to 4 millimeters lower) than the lower end, by which the gas diffused from the opening end 14a does not come into contact with the exposed quartz portion below the silicon coating film 3.

However, the hydrogen fluoride gas is used for etching natural oxide films on the surface of the wafers W to be processed (product wafers) held on the wafer boat 21. Accordingly, the opening end 14a of the third injector 14 needs to be located below the height position of the lowermost wafer W of the wafers W held on the wafer boat 21. In practice, the opening end 14a of the third injector 14 is located at a position 0 to 400 mm below the bottom plate 22a of the wafer boat 21 (which essentially corresponds to the lower end of the process field 1a) and 0 to 400 mm above the first injector 12 for supplying the silicon source gas.

On the other hand, fluorine gas supplied from the second injector 13 is used for removing the silicon coating film 3 that covers the inner surface of the reaction tube 1 and so forth and silicon by-product films deposited inside the reaction tube 1 during the epitaxial growth process. Accordingly, the opening end (the lowermost opening) of the second injector 13 is set at a position equal in height to or below the opening end (the lowermost opening) of the first injector 12 for supplying a silicon source gas.

Next, an explanation will be given of a sequence of processes used when silicon epitaxial growth is performed on silicon wafers W in the vertical heat processing apparatus described above. FIGS. 4 to 7 are schematic sectional views for explaining a method for using the apparatus, according to an embodiment of the present invention.

Figure 4:
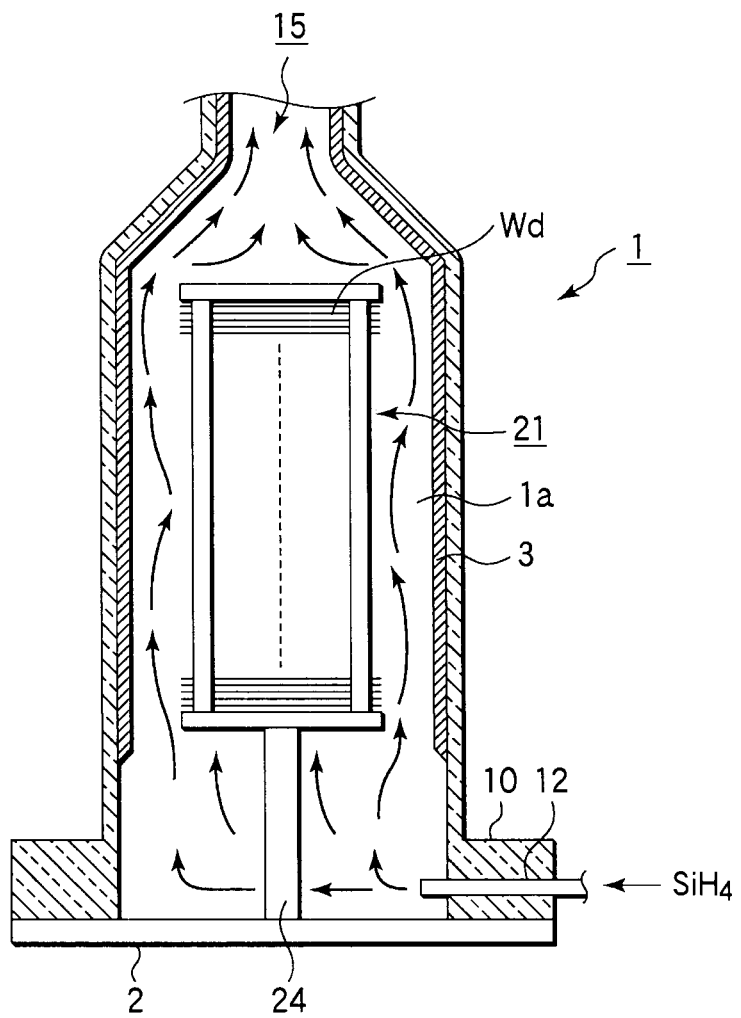
FIGS. 4, 5, 6, and 7 are schematic sectional views for explaining a method for using the apparatus, according to an embodiment of the present invention.

At first, as shown in FIG. 4, a pre-coating process is performed inside the reaction tube 1 accommodating the wafer boat 21 with no product wafers held thereon, to cover the inner surface of the reaction tube 1, the surface of the wafer boat 21, and so forth with a silicon coating film. Accordingly, in this process, the wafer boat 21 is set in a state of holding only dummy wafers Wd without product wafers W, and is then loaded into the reaction tube 1 while the load port 11 is airtightly closed by the lid 2.

Then, while gas is vacuum-exhausted from inside the reaction tube 1 by the vacuum pump 8 through the exhaust line 81 and the reaction tube 1 is heated by the heater 17, mono-silane gas is supplied from the first injector 12 into the reaction tube 1. At this time, the process pressure is set at a value of 13.3 to 1,333 Pa (0.1 to 10 Torr), such as 27 Pa (0.2 Torr), and the process temperature is set at a value of 400 to 700° C., such as 600° C. By this pre-coating process, a silicon coating film 3 is formed to have a thickness of, e.g., 100 nm. FIG. 4 merely shows a silicon coating film 3 formed on the inner surface of the reaction tube 1, but a similar silicon coating film 3 is also formed on the wafer boat 21.

In this pre-coating process, it is preferable to supply only a pre-coating gas, such as mono-silane gas as in this embodiment, without supplying an inactive gas. This is conceived to cover the inner surface of the tip of injectors other than the injector 12 with a silicon coating film 3. For example, the inner surface of the injector 14 is covered with a silicon coating film 3a formed in advance, but the silicon coating film 3a may be pealed off the tip of the injector 14 or the like by a cleaning process performed as described later. Incidentally, the wafer boat 21 may be loaded without the dummy wafers Wd into the reaction tube 1 in this pre-coating process.

In this embodiment, the maximum thickness of natural oxide films on the wafers W to be loaded is known in advance. This maximum thickness of natural oxide films is used to preset the maximum value of the time for performing an etching process of the natural oxide films as described later, such as 60 minutes. On the other hand, the silicon coating film 3 is etched by hydrogen fluoride gas at a rate of 1 nm/minute or less. In consideration of these values, the silicon coating film 3 needs to have a thickness of not less than 60 nm by calculation to prevent the reaction tube 1 and so forth from being etched by hydrogen fluoride gas in the etching process of the natural oxide films. However, in this embodiment, the necessary thickness of the silicon coating film 3 is given a margin, and the silicon coating film 3 is formed to have a thickness of 100 nm, as described above.

After the pre-coating process described above is finished, the supply of mono-silane gas is stopped, and nitrogen gas is supplied from the fifth injector 18 (see FIG. 2) to replace the gas inside the reaction tube 1 with nitrogen gas and to return it to atmospheric pressure. Then, the wafer boat 21 is unloaded from the reaction tube 1.

Then, product wafers W are held on the wafer boat 21 and then start being subjected to processes. As described above, since the product wafers W have been transferred under atmospheric air, natural oxide films of, e.g., 1 nm formed by oxidation are present on their surface. The natural oxide films have to be removed before the epitaxial growth process. This is so because the epitaxial growth process proceeds with crystal grown while maintaining the atomic arrangement of mono-crystalline silicon on the wafers W, but the natural oxide films cut off the crystal information of the underlayer.

Figure 5:
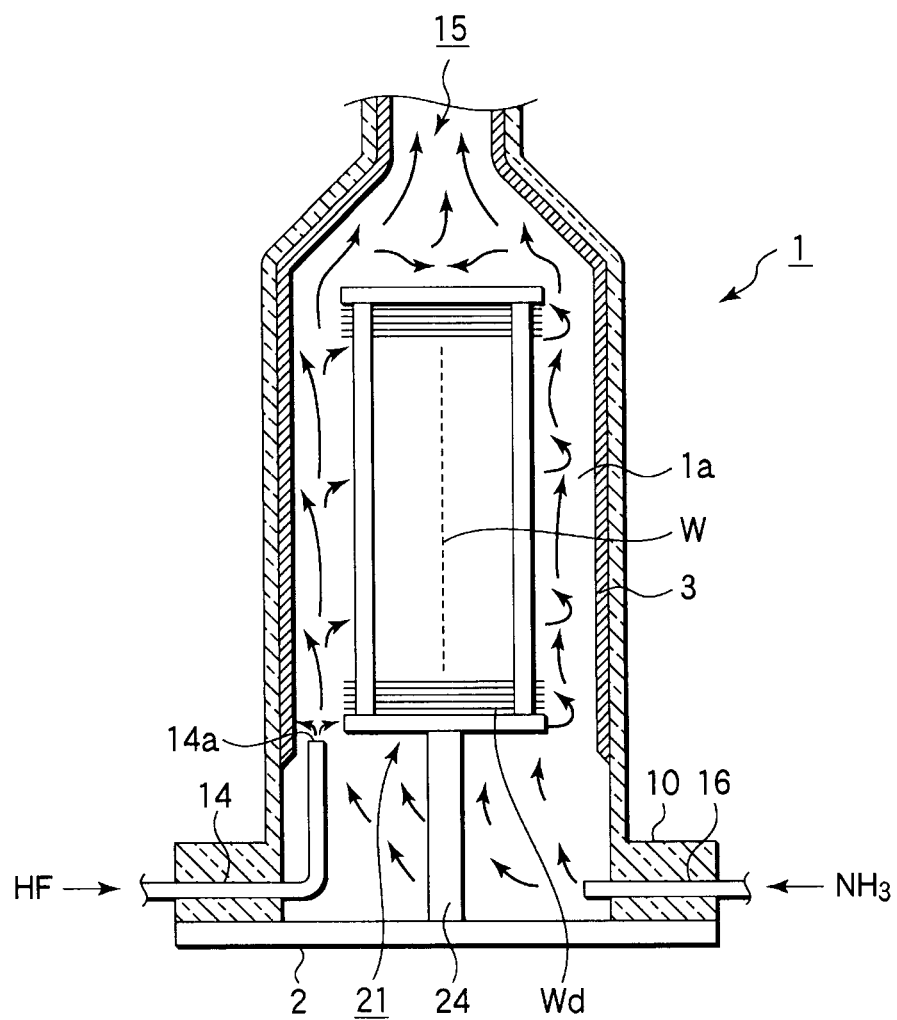

Specifically, as shown in FIG. 5, an etching process of natural oxide films formed on the surface of the product wafers W is performed inside the reaction tube 1 accommodating the wafer boat 21 with the product wafers W held thereon. Accordingly, in this process, the wafer boat 21 is set in a state of the holding dummy wafer Wd and product wafers W (which may include monitor wafers), and is then loaded into the reaction tube 1 while the load port 11 is airtightly closed by the lid 2.

Then, while gas is vacuum-exhausted from inside the reaction tube 1 by the vacuum pump 8 through the exhaust line 81 and the reaction tube 1 is heated by the heater 17, hydrogen fluoride gas is supplied from the third injector 14 and ammonia gas is supplied from the fourth injector 16 both into the reaction tube 1. At this time, the process pressure is set at a value of 13.3 to 53,000 Pa (0.1 to 400 Torr), and the process temperature is set at a value of from room temperature (for example, 25° C.) to 400° C., such as 200° C. The ammonia gas flows up and is mixed with the hydrogen fluoride gas. This mixture gas flows up toward the exhaust port 15 at the top, while it is diffused and supplied onto the surface of the wafers W held on the wafer boat 21 and acts to etch and remove the natural oxide films on the wafers W. After a lapse of a preset time, such as 60 minutes described above, the supply of hydrogen fluoride gas and ammonia gas is stopped, and the residual gas is exhausted from inside the reaction tube 1.

Figure 6:
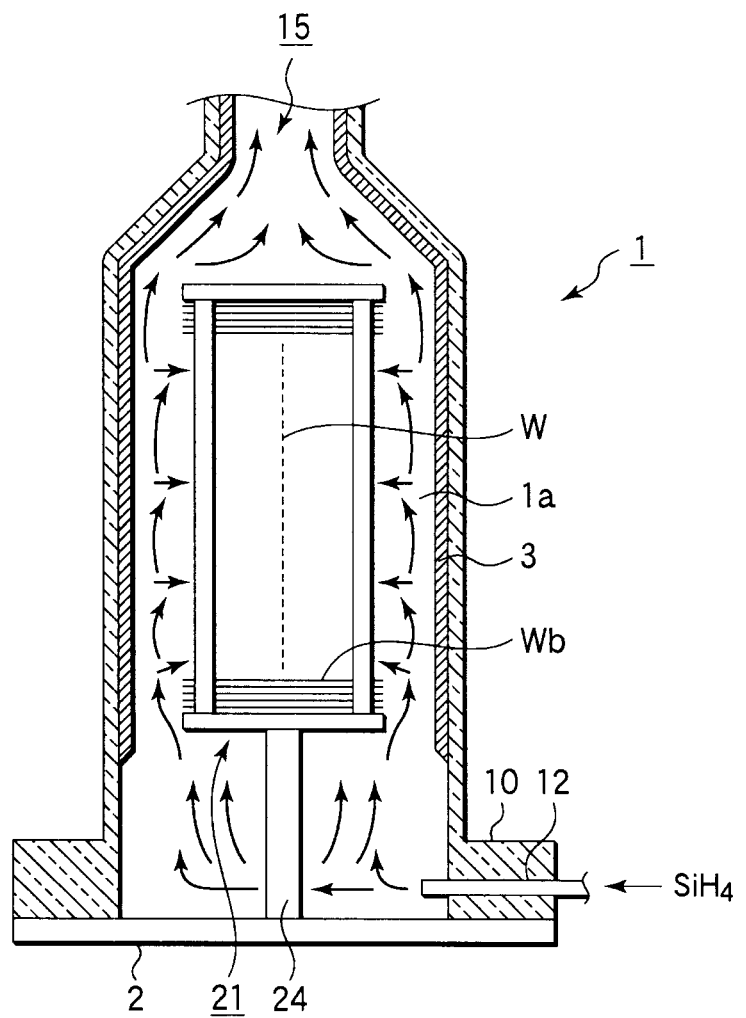

After the etching process of natural oxide films described above is finished, a silicon film formation process is performed, as shown in FIG. 6, inside the reaction tube 1 still containing the wafer boat 21 with the product wafers W held thereon, to form a silicon product film on the surface of the product wafers W. Accordingly, while gas is vacuum-exhausted from inside the reaction tube 1 by the vacuum pump 8 through the exhaust line 81 and the reaction tube 1 is heated by the heater 17, mono-silane gas is supplied from the first injector 12 into the reaction tube 1. At this time, the process pressure is set at a value of 13.3 to 1,333 Pa (0.1 to 10 Torr), such as 27 Pa (0.2 Torr), and the process temperature is set at a value of 400 to 700° C., such as 600° C. By this silicon film formation process, a silicon epitaxial layer is formed on mono-crystalline silicon exposed due to the removal of natural oxide films on the surface of the wafers W. At this time, poly-silicon by-product films are also deposited on the inner surface of the reaction tube 1 and the surface of the wafer boat 21.

After the silicon film formation process described above is finished, the supply of mono-silane gas is stopped, and nitrogen gas is supplied from the fifth injector 18 (see FIG. 2) to replace the gas inside the reaction tube 1 with nitrogen gas and to return it to atmospheric pressure. Then, the wafer boat 21 is unloaded from the reaction tube 1, and the wafers W are taken out of the wafer boat 21.

Figure 7:
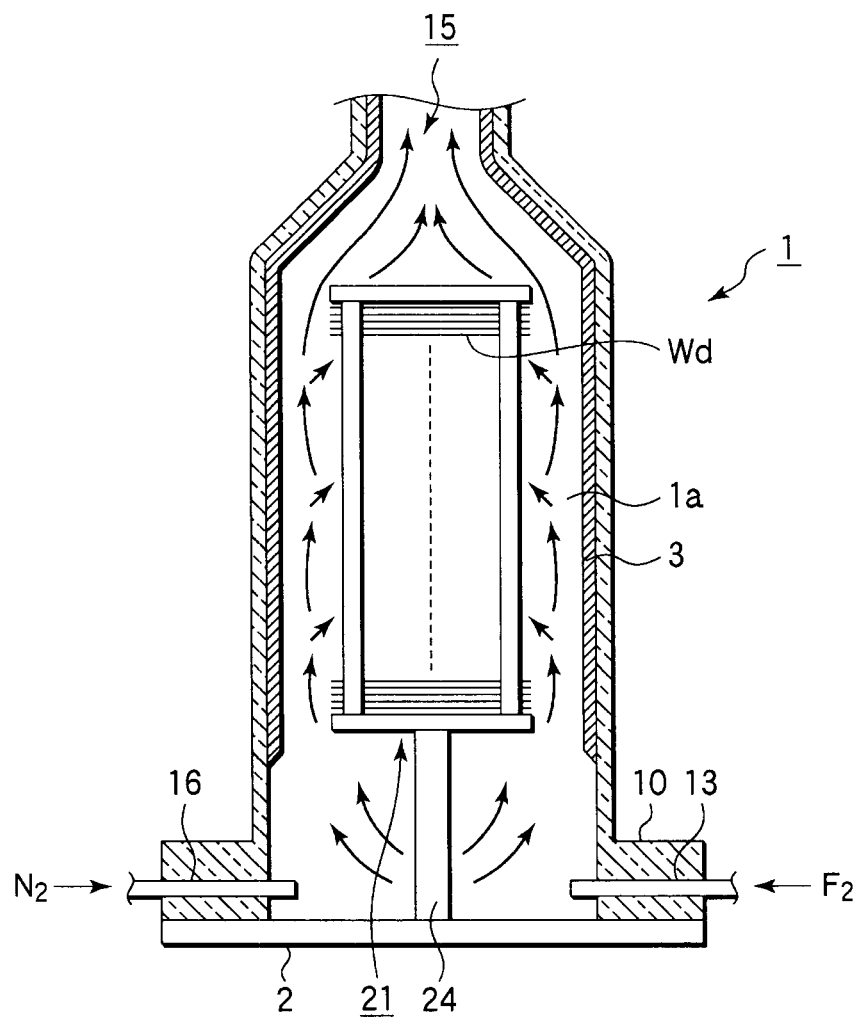

Then, as shown in FIG. 7, a cleaning process is performed inside the reaction tube 1 accommodating the wafer boat 21 with no product wafers held thereon, to etch silicon films present on the inner surface of the reaction tube 1, the surface of the wafer boat 21, and so forth. Accordingly, in this process, the wafer boat 21 is set in a state of holding only dummy wafers Wd without product wafers W, and is then loaded into the reaction tube 1 while the load port 11 is airtightly closed by the lid 2.

Then, while gas is vacuum-exhausted from inside the reaction tube 1 by the vacuum pump 8 through the exhaust line 81 and the reaction tube 1 is heated by the heater 17, a silicon removal gas containing halogen, such as fluorine gas, is supplied from the second injector 13 into the reaction tube 1. At this time, the process pressure is set at a value of 133 to 53,000 Pa (1 to 400 Torr), and the process temperature is set at a value of 200 to 400° C., such as 300° C. This fluorine gas flows up toward the exhaust port 15 at the top, while it is diffused and acts to etch and remove silicon films (the silicon coating film 3 and by-product films) on the inner surface of the reaction tube 1, the surface of the wafer boat 21, and so forth.

At this time, it is preferable to supply nitrogen gas from the nitrogen supply source 55 through the fourth injector 16 into the reaction tube 1. With this supply, quartz components, such as the reaction tube 1 and wafer boat 21, are prevented from being etched after the silicon coating film 3 is removed. Further, it is preferable to also supply nitrogen gas from the third injector 14 into reaction tube 1 to protect the silicon coating film 3a covering the inner surface of the third injector 14.

After the cleaning process described above is finished, the supply of fluorine gas is stopped, and nitrogen gas is supplied from the fifth injector 18 (see FIG. 2) to replace the gas inside the reaction tube 1 with nitrogen gas and to return it to atmospheric pressure. Then, the wafer boat 21 is unloaded from the reaction tube 1. Where the epitaxial growth process is performed again thereafter, the sequence of processes described above is repeated.

As described above, in the vertical heat processing apparatus according to this embodiment, the surface of the reaction tube 1 and wafer boat 21, both made of quartz, is covered with the silicon coating film 3, and then the epitaxial growth process is performed on product wafers W. Immediately before the epitaxial growth process, hydrogen fluoride gas is supplied from the third injector 14 into the reaction tube 1, so that natural oxide films are removed from the wafers W. The opening end 14a of the third injector 14 (the position of the lowermost opening of a supply port for supplying hydrogen fluoride gas) is located between the height level of the lower end of the silicon coating film 3 formed inside the reaction tube 1 and the height level of the lowermost wafer W of the wafers W to be processed (product wafers and/or monitor wafers) on the wafer boat 21. Accordingly, the hydrogen fluoride gas is not supplied onto portions with no silicon coating film 3 formed thereon inside the reaction tube 1, so that the reaction tube 1 is prevented from being etched. Further, the inner surface of the third injector 14 is covered with the silicon coating film 3a formed in advance, and the third injector 14 is thereby protected from etching by the hydrogen fluoride gas being supplied. Accordingly, it is possible to curb particle generation due to etching of the reaction tube 1 and third injector 14 by the hydrogen fluoride gas and thus to prevent the yield of devices from being decreased due to particle contamination.

Although the silicon coating film 3a protects the inner surface of the third injector 14, the silicon coating film 3a itself is gradually and slightly etched by the hydrogen fluoride gas being supplied. According to this embodiment, in light of this matter and a thickness that is hard to cause film crack and so forth, the silicon coating film 3a of the third injector 14 has a very large thickness of 3 μm, so that it can stand long use.

Second Embodiment

Figure 8:
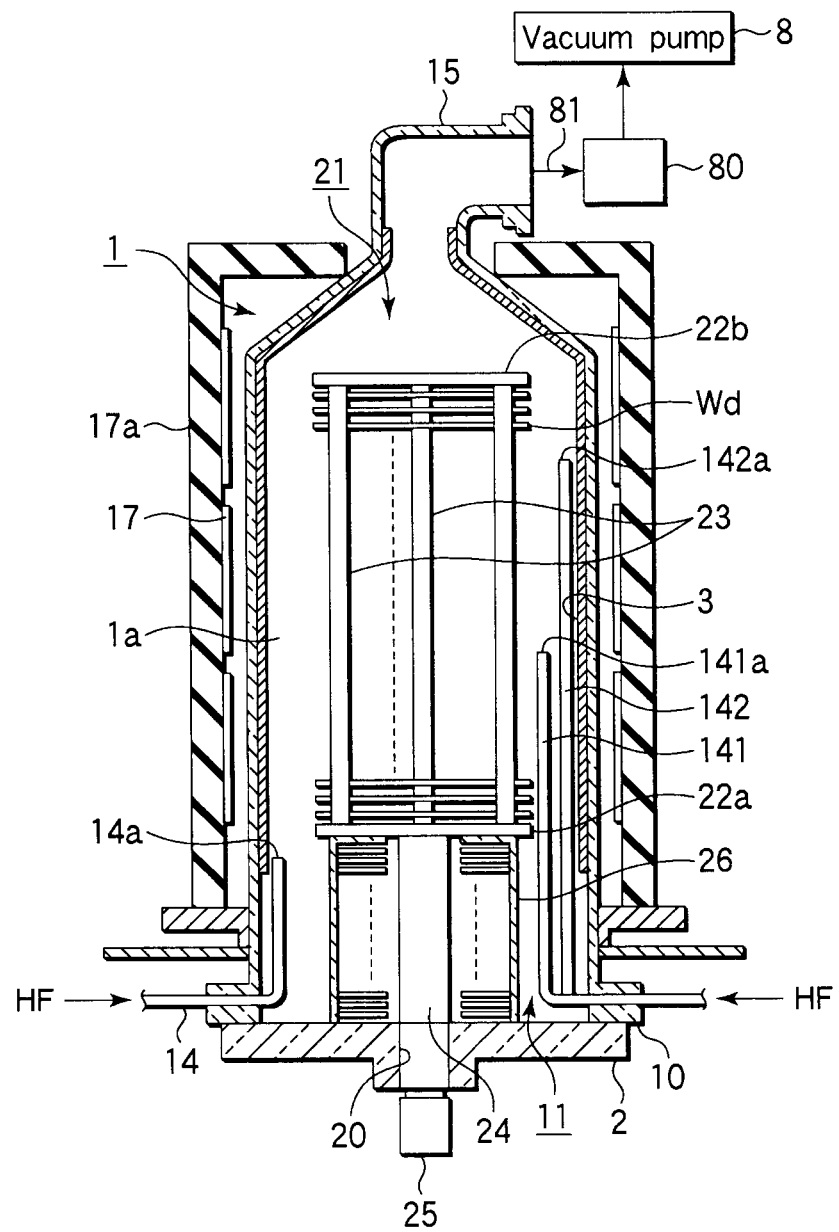
FIG. 8 is a sectional side view showing a vertical heat processing apparatus (silicon film formation apparatus) according to a second embodiment of the present invention.
Figure 9:
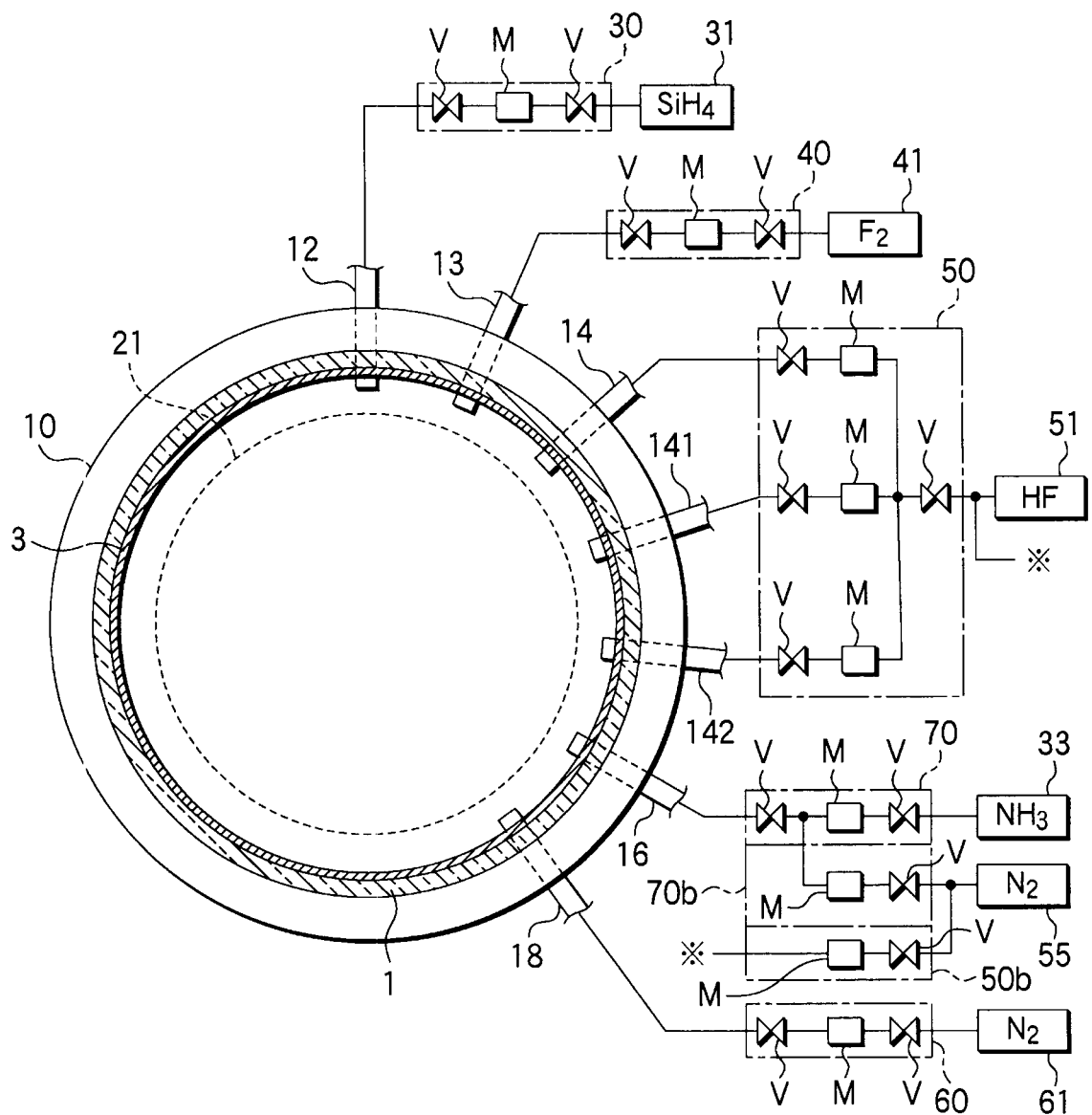
FIG. 9 is a sectional plan view showing an example of the plan view layout of injectors used in the heat processing apparatus shown in FIG. 8.

FIG. 8 is a sectional side view showing a vertical heat processing apparatus (silicon film formation apparatus) according to a second embodiment of the present invention. FIG. 9 is a sectional plan view showing an example of the plan view layout of injectors used in the heat processing apparatus shown in FIG. 8. In the second embodiment, the gas supply passage for supplying hydrogen fluoride gas, i.e., a process gas for removing natural oxide films, into the reaction tube 1 includes additional injectors 141 and 142, such as two injectors, as shown in FIG. 8, in addition to the third injector 14 described above.

The injector 14 severs to provide the main gas supply port and is structured as in the first embodiment. Specifically, the opening end 14a of the third injector 14 is located between the height level of the lower end of the silicon coating film 3 formed inside the reaction tube 1 and the height level of the lowermost wafer W of the wafers W to be processed (product wafers and/or monitor wafers) on the wafer boat 21.

The injectors 141 and 142 serve to provide auxiliary gas supply ports to compensate for a shortfall of hydrogen fluoride gas on an upper side of the wafer boat 21 due to consumption of the gas supplied form the main gas supply line or injector 14. Accordingly, the gas supply ports or opening ends 141a and 142a of the injectors 141 and 142 are located at height positions within the process field 1a. In other words, the opening ends 141a and 142a are located at height positions above the height level of the lowermost wafer W of the wafers W to be processed on the wafer boat 21. The opening end 141a of the injector 141 is located at a position several wafers below the vertical center of the range for holding wafers W to be processed in the wafer boat 21. The opening end 142a of the injector 142 is located at a position several wafers below the top of the range for holding wafers W to be processed in the wafer boat 21.

As shown in FIG. 9, the injectors 14, 141, and 142 are connected to the third gas supply source 51 described above through a gas regulating section 50 including valves V and flow rate controllers M. Accordingly, the injectors 14, 141, and 142 can be independently controlled in terms of the flow rate and supply/stop of hydrogen fluoride gas delivered from their opening ends 14a, 141a, and 142a. FIG. 8 shows the three injectors 14, 141, and 142 separately on the right and left of the wafer boat 21 for the sake of convenience. However, as shown in FIG. 9, the injectors 14, 141, and 142 are disposed side by side equidistantly in the annular direction of the flange 10. The inner surface of the injectors 141 and 142 is also covered with a silicon coating film 3a formed in advance by pre-coating as in the injector 14.

In the etching process of the natural oxide films, hydrogen fluoride gas supplied from the injector 14 is mixed with ammonia gas supplied from the fourth injector 16 (see FIG. 9). This mixture gas flows up toward the exhaust port 15 at the top, while it is diffused and acts to etch the natural oxide films on the wafers W held on the wafer boat 21, in ascending order of the wafers W. At this time, while the hydrogen fluoride gas supplied from the injector 14 flows upward, the hydrogen fluoride gas is gradually consumed in etching the natural oxide films and thus may cause a shortfall of effective gas part.

However, in the vertical heat processing apparatus according to the second embodiment, new hydrogen fluoride gas can be supplied from the opening ends 141a and 142a of the injectors 141 and 142 located above the opening end 14a of the injector 14 to compensate for the shortfall. Consequently, the natural oxide films are removed from the wafers W on the wafer boat 21 with high inter-wafer uniformity among the wafers W and with high planar uniformity on each of the wafers W.

It should be noted that, depending on conditions, such as the height of the wafer boat 21, the single injector 14 of hydrogen fluoride gas may suffice for a good process as in the first embodiment. Accordingly, the present invention does not necessarily require use of a plurality of injectors of hydrogen fluoride gas. According to the second embodiment, two or more injectors are employed, such that at least one of them is located to provide the main gas supply port described above and at least another one of them is located to provide an auxiliary gas supply port above the main gas supply port.

Third Embodiment

Figure 10:
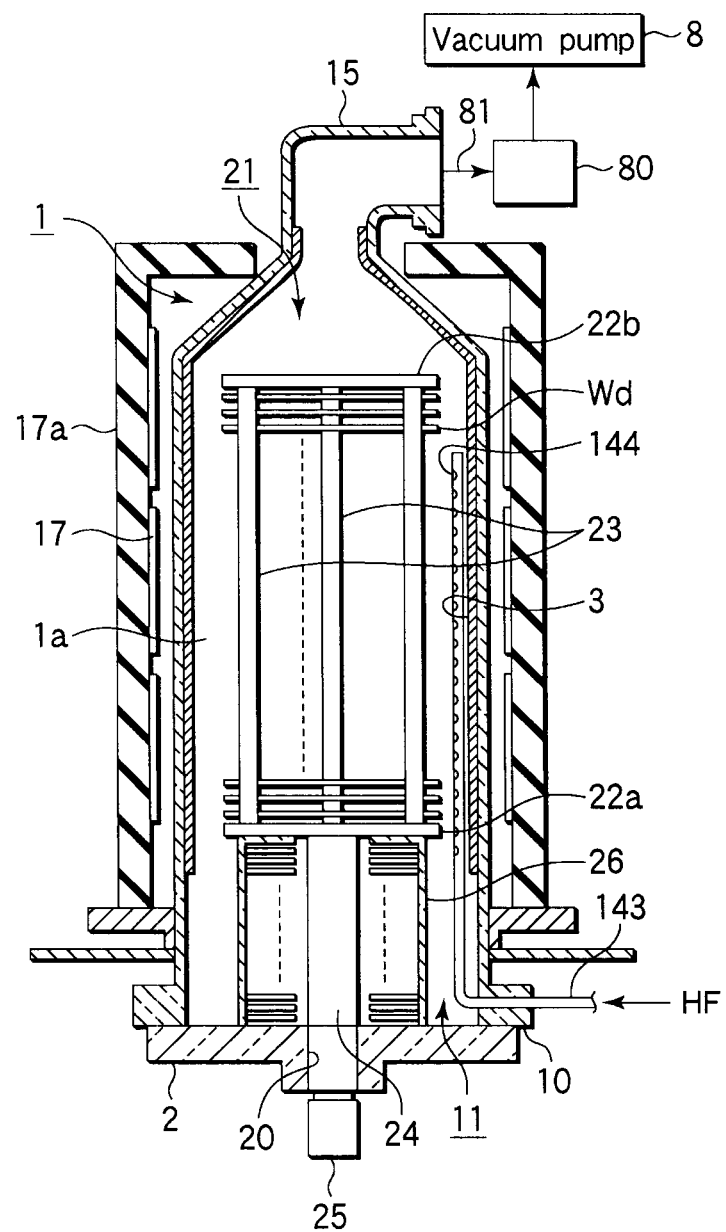
FIG. 10 is a sectional side view showing a vertical heat processing apparatus (silicon film formation apparatus) according to a third embodiment of the present invention.

FIG. 10 is a sectional side view showing a vertical heat processing apparatus (silicon film formation apparatus) according to a third embodiment of the present invention. In the third embodiment, the gas supply passage for supplying hydrogen fluoride gas into the reaction tube 1 employs a gas distribution nozzle 143 extending in the vertical direction inside the reaction tube 1 along the process field 1a.

The gas distribution nozzle 143 has a plurality of gas delivery holes 144 formed thereon over the entirety of the process field 1a at intervals, e.g., corresponding to the wafers W held on the wafer boat 21. Of these gas delivery holes 144, the lowermost gas delivery hole is located between the height level of the lower end of the silicon coating film 3 formed inside the reaction tube 1 and the height level of the lowermost wafer W of the wafers W to be processed on the wafer boat 21. In practice, the lowermost gas delivery hole of gas delivery holes 144 of the gas distribution nozzle 143 is located at a position 0 to 400 mm below the bottom plate 22a of the wafer boat 21 (which essentially corresponds to the lower end of the process field 1a) and 0 to 400 mm above the first injector 12 for supplying the silicon source gas.

FIG. 10 shows only part of the gas delivery holes 144 and schematically illustrates the intervals of the gas delivery holes 144. This embodiment also has the single fourth injector 16 of ammonia gas as in the first embodiment. The gas distribution nozzle 143 is partly covered with a silicon coating film 3a formed in advance at portions around the gas delivery holes 144 (the inner surface of the gas delivery holes 144), as in the injector 14.

In the third embodiment, gas delivery holes 144 of the gas delivery holes 144 above the lowermost gas delivery hole 144 serves to compensate for a shortfall of hydrogen fluoride gas. Consequently, the natural oxide films are removed from the wafers W on the wafer boat 21 with high inter-wafer uniformity among the wafers W. Other injectors may be formed of gas distribution nozzles, and, in this case, the gas distribution nozzles may be arranged to stand, as shown in FIG. 10, side by side in the annular direction inside the reaction tube 1. Even where another injector is formed of a gas distribution nozzle, it can be combined with the L-shaped third injector 14 shown in FIG. 1.

Experiment

In the vertical heat processing apparatus shown in FIG. 1, a process sequence of a present example according to the first embodiment of the present invention was conducted. In this process sequence, a pre-coating process was first performed to cover the inner surface of the reaction tube 1 and the surface of the wafer boat 21 with a silicon coating film. Then, the wafer boat 21 was set to hold test wafers Wa, Wb, and Wc (bare wafers) and dummy wafers and loaded into the reaction tube 1. As the dummy wafers, several wafers were placed on each of the top and bottom of the wafer boat 21. The test wafer Wa was placed immediately below the upper dummy wafers on the wafer boat 21. The test wafer Wb was placed at the center of the wafer boat. The test wafer Wc was placed immediately above the lower dummy wafers on the wafer boat 21.

Then, hydrogen fluoride gas and ammonia gas were supplied into the reaction tube 1 to perform a process for removing natural oxide films on the test wafers W. After the process for removing natural oxide films was finished, the wafer boat 21 was unloaded, and the number of particles not smaller than 0.08 μm deposited on the test wafers Wa, Wb, and Wc was measured by a wafer surface examination unit. In this present example, the pre-coating process and the process for removing natural oxide films were performed under the process conditions described in the first embodiment of the present invention.

Further, in the vertical heat processing apparatus shown in FIG. 12, a process sequence of a comparative example according to a conventional technique was conducted. In this process sequence, the pre-coating process and the process for removing natural oxide films were performed by use of the same conditions as those of the process sequence of the present example in terms of the process pressures, process temperatures, process times, and dummy wafers. In the comparative example, test wafers Wa', Wb', and Wc' (bare wafers) were placed at the same positions as the test wafers Wa, Kb, and Wc for the present example.

Figure 11:
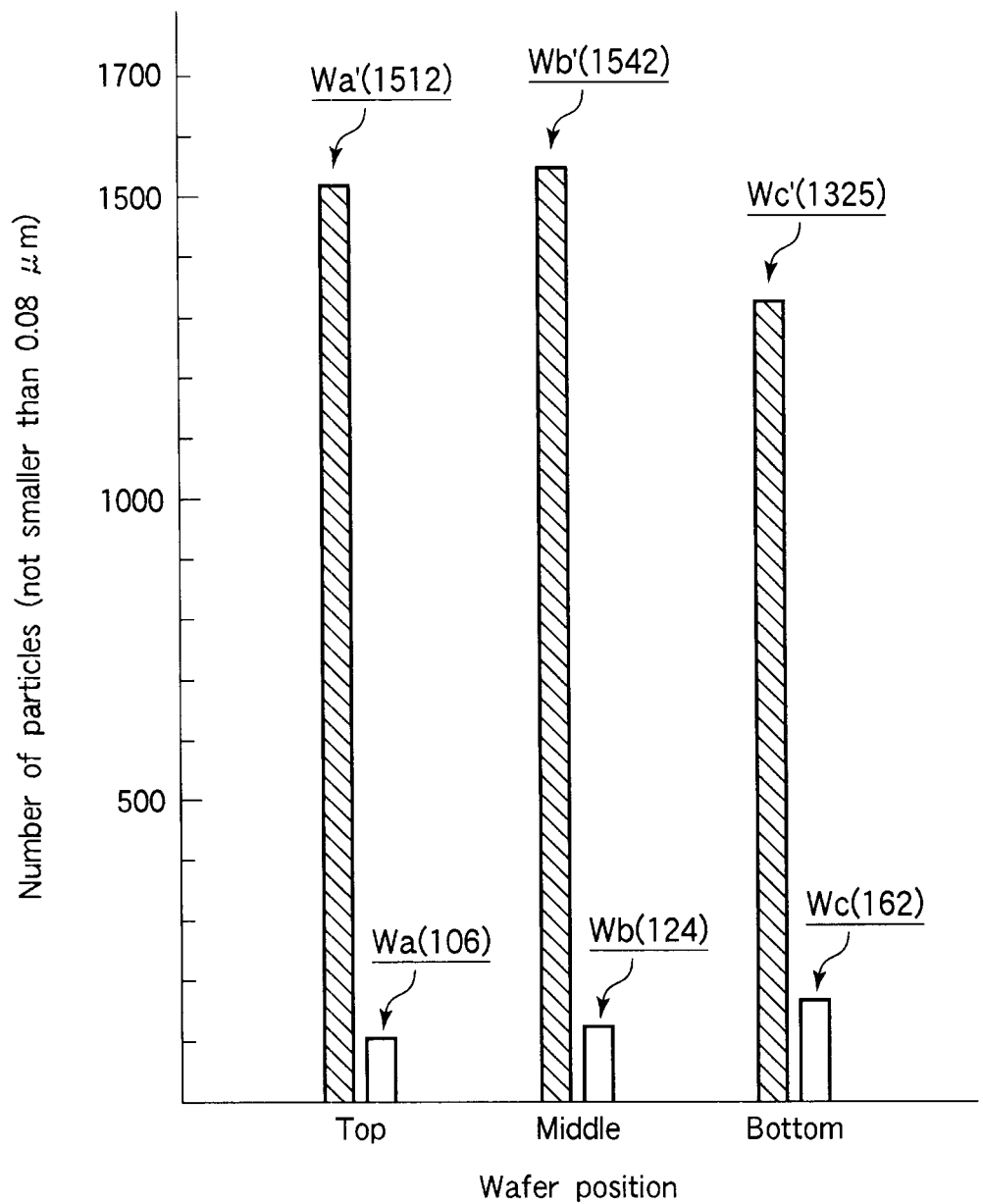
FIG. 11 is a graph showing results of an experiment concerning particle generation.

FIG. 11 is a graph showing results of the experiment concerning particle generation. In FIG. 11, the vertical axis denotes the number of particles deposited on the wafers W, and the horizontal axis denotes the positions of the wafers W on the wafer boat 21 (slot positions). As shown in FIG. 11, the present example according to the first embodiment of the present invention rendered such that the number of particles deposited on the wafers was 106 on the wafer Wa, 124 on the wafer Wb, and 162 on the wafer Wc. On the other hand, the comparative example according to a conventional technique rendered such that the number of particles deposited on the wafers was 1,512 on the wafer Wa', 1,542 on the wafer Wb', and 1,325 on the wafer Wc'. Accordingly, the number of particles deposited on the wafers Wa', Wb', and Wc' for the comparative example was about ten times larger than that of the wafers Wa, Wb, and Wc for the present example. From this result, it was confirmed that the process sequence using the vertical heat processing apparatus shown in FIG. 1 remarkably reduced the number of particles as compared with the process sequence using the vertical heat processing apparatus shown in FIG. 12.

Other Modifications

In the first to third embodiments, mono-silane gas is supplied as a silicon source gas from the first gas supply source 31. However, the silicon source gas may be another silane family gas, such as disilane ($Si_2H_6$), dichlorosilane ($SiH_2Cl_2$), hexachlorodisilane ($Si_2Cl_6$), or cyclopentasilane ($Si_5H_{10}$).

In the first to third embodiments, hydrogen fluoride (HF) gas (etching gas) and ammonia ($NH_3$) gas (vaporization promoting gas) are supplied to remove natural oxide films. However, only hydrogen fluoride gas may be supplied to remove natural oxide films. In the first to third embodiments, fluorine ($F_2$) gas is supplied as a cleaning gas. However, the cleaning gas may be chlorinetrifluoride ($ClF_3$) gas. The pre-coating process of the silicon coating film 3 and the cleaning process for removing silicon films by a cleaning gas may be performed not every time for processing one batch (each time) but every time for processing two or more batches.

In the first to third embodiments, the reaction tube 1 is formed of a single tube. However, the reaction tube may have a double tube structure including an inner tube with its top and bottom opened and an outer tube with its top opened surrounding the inner tube. In this case, a process gas supplied from the bottom of the inner tube flows up to the opened top of the inner tube and then flows down through the gap between the inner and outer tube, and then is exhausted from an exhaust port formed at the bottom of the outer tube. Accordingly, in either the single tube or double tube, the exhaust system exhausts gas from inside the reaction tube 1 while drawing gas upward through the process field 1a.

In the first to third embodiments, the silicon film formation process is exemplified by silicon epitaxial growth. However, the present invention may be applied to another process sequence for forming a silicon film after removing natural oxide films on the underlayer because the natural oxide films hinders the film formation. An example of the this kind is a process sequence in which an underlayer film is formed on a target object in one apparatus, then the target object is transferred under atmospheric air, and then a silicon film is formed on the underlayer film in another apparatus. Such a process sequence appears in manufacturing semiconductor devices using as a conductive portion a poly-silicon film doped with an n-type or p-type impurity.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A silicon film formation apparatus that forms a silicon film on a silicon surface by epitaxial growth, the apparatus comprising:
   a vertical reaction tube made of quartz and having a process field for accommodating a plurality of target objects and a lower area below the process field;
   a holder made of quartz and configured to hold the target objects at intervals in a vertical direction inside the process field;
   a heater disposed outside the reaction tube to surround the process field at a position above the lower area and configured to heat the target objects inside the process field;
   a gas supply system configured to supply process gases into the process field;
   an exhaust system configured to exhaust gas from inside the reaction tube while drawing gas upward through the lower area and the process field; and
   a control section configured to control an operation of the apparatus and including a computer and a non-transitory computer readable storage medium that stores a program conducting a sequence of using the apparatus,
   wherein the gas supply system includes:
      a first supply part connected to a silicon source gas supply and being configured to supply a silicon source gas into the reaction tube from a first supply port having a lowermost opening at a first position inside the lower area,
      a second supply part connected to an etching gas supply and being configured to supply a hydrogen fluoride etching gas for preferentially etching and removing natural oxide into the reaction tube from a second supply port having a lowermost opening at a position inside the lower area between the process field and the first position, and
      a third supply part connected to a cleaning gas supply and being configured to supply a cleaning gas containing fluorine for preferentially etching and removing silicon into the reaction tube from a third supply port having a lowermost opening at a position inside the lower area equal in height to or below the first position, and
   wherein the program causes the computer to control the apparatus to conduct the sequence, the sequence including:
      performing a pre-coating process inside the reaction tube accommodating the holder with no product target objects held thereon to cover an inner surface of the reaction tube and a surface of the holder with a silicon coating film, by supplying the silicon source gas into the reaction tube from the first supply port, while exhausting gas from inside the reaction tube by the exhaust system,
      then, performing an etching process inside the reaction tube accommodating the holder with a plurality of product target objects held thereon to etch and remove silicon natural oxide films formed on a target silicon surface of the product target objects, by supplying the etching gas into the reaction tube from the second supply port, while exhausting gas from inside the reaction tube by the exhaust system,
      then, performing a silicon film formation process inside the reaction tube accommodating the holder with the product target objects held thereon to form a silicon product film by epitaxial growth on the target silicon surface of the product target objects, by supplying the silicon source gas into the reaction tube from the first supply port, while exhausting gas from inside the reaction tube by the exhaust system, and
      then, performing a cleaning process inside the reaction tube accommodating the holder with no product target objects held thereon to etch and remove the silicon coating film and silicon by-product films formed by the silicon film formation process on the inner surface of the reaction tube and the surface of the holder, by supplying the cleaning gas into the reaction tube from the third supply port, while exhausting gas from inside the reaction tube by the exhaust system.

2. The apparatus according to claim 1, wherein the product target objects are silicon wafers.

3. The apparatus according to claim 1, wherein the second supply port further comprises an additional opening disposed at a height within the process field.

4. The apparatus according to claim 3, wherein the lowermost opening and the additional opening of the second supply port are respectively formed on a plurality of nozzles disposed inside the reaction tube.

5. The apparatus according to claim 3, wherein the lowermost opening and the additional opening of the second supply port comprise a plurality of gas delivery holes formed on a gas distribution nozzle disposed inside the reaction tube and extending in the vertical direction along the process field.

6. The apparatus according to claim 1, wherein the lowermost opening of the second supply port is disposed above a position 4 millimeters below the silicon coating film.

7. The apparatus according to claim 1, wherein the gas supply system further includes a fourth supply part configured to supply ammonia gas into the reaction tube from a fourth supply port having a lowermost opening at a position inside the lower area, and the etching process includes supplying the ammonia gas, along with supply of the hydrogen fluoride gas, into the reaction tube from the fourth supply port to promote vaporization of products generated by the etching process.

8. The apparatus according to claim 7, wherein the fourth supply) port has an opening below the lowermost opening of the second supply port.

9. The apparatus according to claim 1, wherein the cleaning gas is fluorine gas or chlorinetrifluoride gas.

* * * * *